(12) United States Patent
Franzke et al.

(10) Patent No.: US 11,043,368 B2
(45) Date of Patent: Jun. 22, 2021

(54) METHOD FOR IONIZING GASEOUS SAMPLES BY MEANS OF A DIELECTRIC BARRIER DISCHARGE AND FOR SUBSEQUENTLY ANALYZING THE PRODUCED SAMPLE IONS IN AN ANALYSIS APPLIANCE

(71) Applicant: Leibniz-Institut für Analytische Wissenschaften-ISAS-e.V., Dortmund (DE)

(72) Inventors: Joachim Franzke, Dortmund (DE); Felix David Klute, Bochum (DE); Sebastian Brandt, Arnsberg (DE); Wolfgang Vautz, Unna (DE)

(73) Assignee: Leibniz-Institut Für Analytische Wissenschaften-ISAS-e.V., Dortmund (DE)

( * ) Notice: Subject to any disclaimer, the term of this patent is extended or adjusted under 35 U.S.C. 154(b) by 57 days.

(21) Appl. No.: 16/615,172

(22) PCT Filed: May 23, 2018

(86) PCT No.: PCT/EP2018/063480
§ 371 (c)(1),
(2) Date: Nov. 20, 2019

(87) PCT Pub. No.: WO2018/224307
PCT Pub. Date: Dec. 13, 2018

(65) Prior Publication Data
US 2020/0227245 A1 Jul. 16, 2020

(30) Foreign Application Priority Data
Jun. 9, 2017 (DE) .................. 10 2017 112 726.7

(51) Int. Cl.
*H01J 49/10* (2006.01)
*G01N 27/62* (2021.01)
(Continued)

(52) U.S. Cl.
CPC .......... *H01J 49/105* (2013.01); *G01N 27/622* (2013.01); *H05H 1/2406* (2013.01);
(Continued)

(58) Field of Classification Search
CPC ... H01J 49/105; G01N 27/622; H05H 1/2406; H05H 2001/2412; H05H 2001/245; H05H 2001/2456
(Continued)

(56) References Cited

U.S. PATENT DOCUMENTS 7,973,279 B2   7/2011   Baumbach et al.
2012/0292501 A1*  11/2012  Sugiyama ............ H01J 49/105
                                                          250/288

FOREIGN PATENT DOCUMENTS

DE    10 2006 050 136 A1   5/2008
EP       2 530 702 A1       12/2012
WO     2006/001455 A1       1/2006

OTHER PUBLICATIONS

International Search Report in PCT/EP2018/063480, dated Aug. 21, 2018.
(Continued)

*Primary Examiner* — Nicole M Ippolito
(74) *Attorney, Agent, or Firm* — Collard & Roe, P.C.

(57) ABSTRACT

A method for ionizing gaseous samples by dielectric barrier discharge and for subsequently analyzing the produced sample ions in an analysis appliance, in particular a mass spectrometer or an ion mobility spectrometer, produces the sample ions by a plasma caused by a dielectric barrier discharge, wherein the dielectric barrier discharge is pro-
(Continued)

Figure 1:
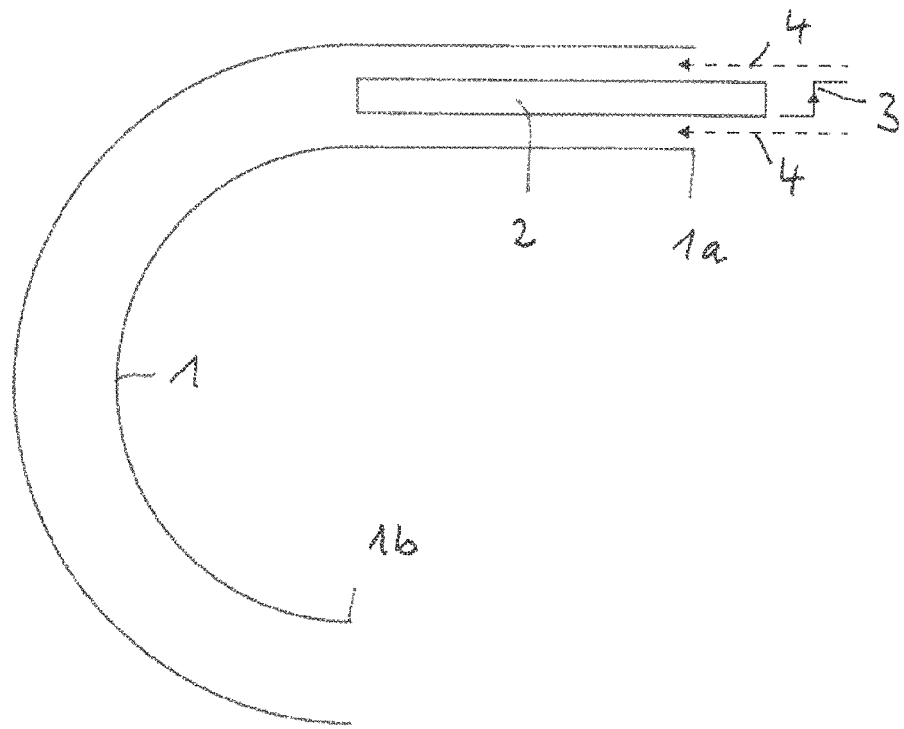

duced by virtue of a plasma gas being supplied through a capillary made of a dielectric material, wherein a wire-shaped electrode is arranged within the capillary, the electrode being connected to an AC voltage source, wherein the gaseous sample is supplied to the exit region of the capillary, wherein the wire-shaped electrode is connected to the AC voltage source on the high-voltage side.

10 Claims, 4 Drawing Sheets

(51) Int. Cl.
H05H 1/24 (2006.01)
G01N 27/622 (2021.01)

(52) U.S. Cl.
CPC ............... H05H 2001/245 (2013.01); H05H 2001/2412 (2013.01); H05H 2001/2456 (2013.01)

(58) Field of Classification Search
USPC ............ 250/423 R, 424, 423 F, 423 P, 288
See application file for complete search history.

(56) References Cited

OTHER PUBLICATIONS

Michels et al., "Spectroscopic characterization of a microplasma used as ionization source for ion mobility spectrometry", Elsevier, Spectrochimica Acta Part B vol. 62, No. 11 (2007) pp. 1208-1215.

* cited by examiner

METHOD FOR IONIZING GASEOUS SAMPLES BY MEANS OF A DIELECTRIC BARRIER DISCHARGE AND FOR SUBSEQUENTLY ANALYZING THE PRODUCED SAMPLE IONS IN AN ANALYSIS APPLIANCE

CROSS REFERENCE TO RELATED APPLICATIONS

This application is the National Stage of PCT/EP2018/063480 filed on May 23, 2018, which claims priority under 35 U.S.C. § 119 of German Application No. 10 2017 112 726.7 filed on Jun. 9, 2017, the disclosure of which is incorporated by reference. The international application under PCT article 21(2) was not published in English.

The invention relates to a method for ionization of gaseous samples by means of dielectric barrier discharge and for subsequent analysis of the sample ions produced, in an analysis device, in particular a mass spectrometer or an ion mobility spectrometer, wherein the sample ions are produced by means of a plasma that is brought about by means of a dielectric barrier discharge, wherein the dielectric barrier discharge is generated in that a plasma gas is supplied through a capillary composed of a dielectric material, wherein a wire-shaped electrode is arranged within the capillary, which electrode is connected with an alternating voltage source, wherein the gaseous sample is supplied to the exit region of the capillary.

A method for ionization of gaseous samples is known from DE 10 2006 050 136 A1 of the applicant, wherein the sample ions are analyzed in an analysis device, namely an ion mobility spectrometer or a mass spectrometer, after ionization. In this regard, a noble gas is passed through a capillary composed of a dielectric material, for example glass, as the plasma gas, wherein two ring electrodes are arranged bordering on the exit region of the capillary, on the outside of the capillary, at a distance of approximately 1 cm from one another. A plasma between the electrodes and a plasma at the exit of the capillary are generated by means of application of an alternating high voltage. For ionization of a gaseous sample, the gaseous sample is conducted into the exit region of the capillary from the outside, i.e. into the plasma at the exit, and ionized there; the gaseous sample itself does not enter into the capillary. The sample ions produced in this manner subsequently get into an ion mobility spectrometer or into a mass spectrometer, and are analyzed there. This method of ionization, in which the two electrodes are separated dielectrically from the plasma gas by means of the capillary, is also referred to as having a full dielectric barrier.

Aside from this full dielectric barrier discharge, a half dielectric barrier discharge is also known, in which only one electrode, namely the one that is connected with the high-voltage source on the high-voltage side, is arranged on the outside of the capillary and thereby dielectrically separated from the plasma gas, while the second wire-shaped electrode is arranged within the capillary and is connected with the ground of the high-voltage source, in order to prevent electrical breakdown to the inlet of the mass spectrometer from occurring from this electrode.

In the case of the two aforementioned configurations, the electrode connected with the high-voltage source on the high-voltage side is arranged on the outside of the capillary, in the region of the exit end, and thereby in the immediate vicinity to the inlet of the mass spectrometer or the ionization chamber of the ion mobility spectrometer. This can lead to short-circuits and, in particular in the case of ion mobility spectrometry, to disruptions of the internal electrical field. Furthermore, it is necessary that the electrode, which generally lies against the outside of the capillary in ring shape, is well insulated, so as to preclude hazards.

It is therefore the task of the invention to prevent an influence on the analysis device by means of the alternating voltage source for plasma generation.

This task is accomplished, in the case of a method of the type indicated initially, in that the wire-shaped electrode is connected with the alternating voltage source on the high-voltage side.

In contrast to the state of the art, the wire-shaped electrode situated within the capillary is therefore connected with the high-voltage source on the high-voltage side, wherein the electrode is shorter than the capillary, but depending on the application case, can fundamentally be arranged within the capillary with a variable length. Then no electrode connected with the high-voltage source on the high-voltage side is present on the outside of the capillary, so that no influences on the analysis device can occur. Furthermore, the structure of the capillary is significantly simpler as a result, the electrical connection of the electrode is situated at a distance from the exit of the capillary, at the other end of the latter, and electrical insulation for shielding with regard to the analysis device, in the region of the exit of the capillary, is not necessary. Surprisingly, it has been found that with a half dielectric barrier discharge structured in this way, significantly better ionization of the sample gas is possible. For analysis results that can be evaluated, a sample gas stream of about 10 to 50 ml per minute is sufficient, as compared with a sample gas stream of about 200 to 300 ml per minute in the case of conventional methods.

According to a first embodiment, it is provided that a second electrode connected with the ground of the high-voltage source is eliminated. The ground is then formed by the surroundings, so to speak, for example the housing of the analysis device; such a structure then acts like a capacitor.

Alternatively, it can be provided that the ground of the alternating voltage source is connected with an electrode arranged on the outside of the capillary.

In a preferred embodiment, it is provided that helium, argon, hydrogen, nitrogen or air is used as the plasma gas. It has surprisingly been found that in contrast to conventional methods, not only the aforementioned noble gases but also hydrogen, nitrogen or even air are suitable as a plasma gas.

Preferably, it is provided that a square-wave voltage is used as the alternating voltage.

In this regard, it is advantageous if the frequency of the square-wave voltage amounts to 5 to 60 kHz, and a square-wave voltage in the range of 1 to 4 kV is used.

In a very particularly preferred embodiment, it is provided that a flexible, bendable capillary is used. It has surprisingly been found that it is possible to generate a plasma that reaches from the end of the electrode all the way to the exit of the capillary, specifically both in a straight line and in an arc shape. The spread of the plasma can be influenced by the geometrical dimensions of the electrode wire and the length of the electrode within the capillary.

Preferably, a capillary composed of quartz glass having an outer coating of polyimide is used for this purpose. Alternatively, PEEK, Teflon® or boron silicate glass can be used as materials.

The capillary preferably has an inside diameter between 50 and 400 µm. The diameter of the electrode wire is correspondingly smaller.

Depending on the application case, it is provided that the gaseous sample is supplied through the capillary or that the gaseous sample is passed into the exit region of the capillary from the outside, without passing through the capillary.

Figure 2:
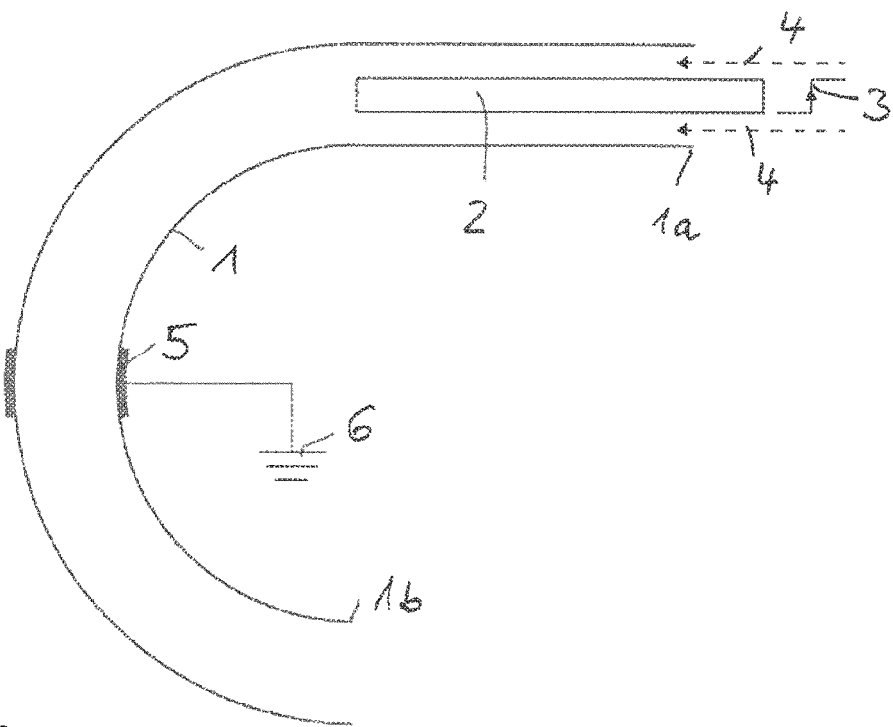
Figure 3:
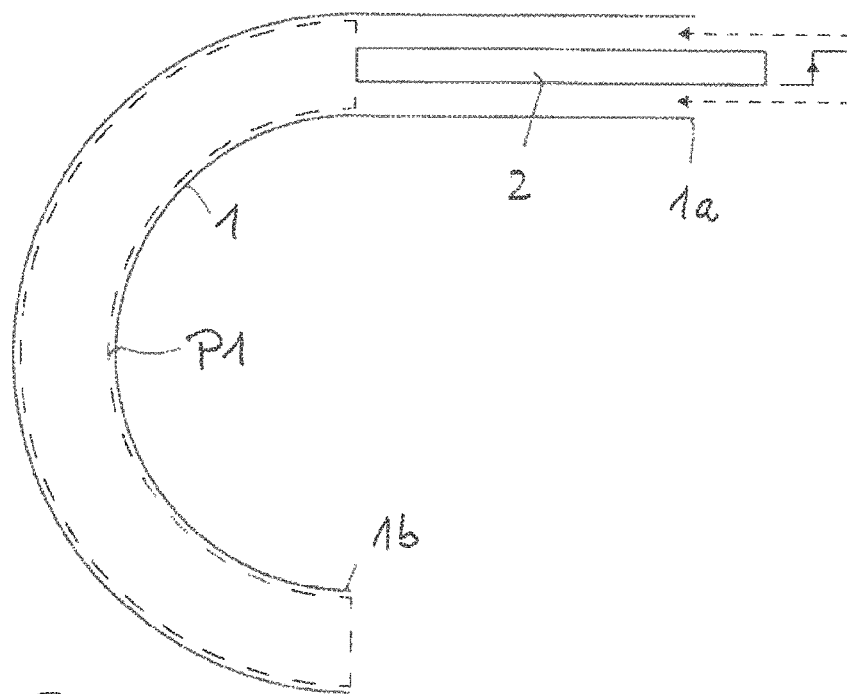
Figure 4:
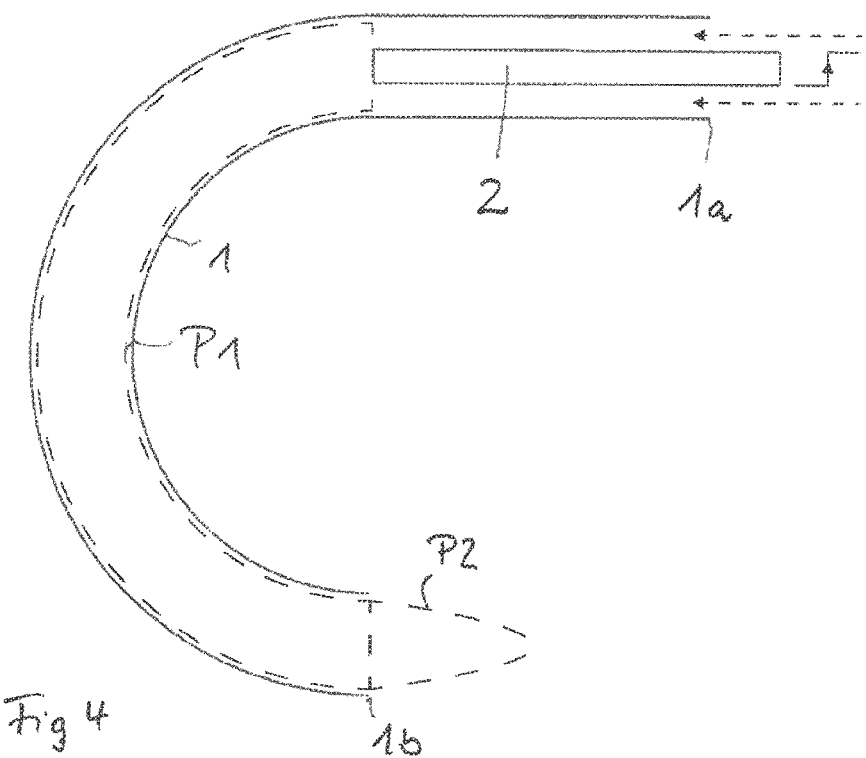
Figure 5:
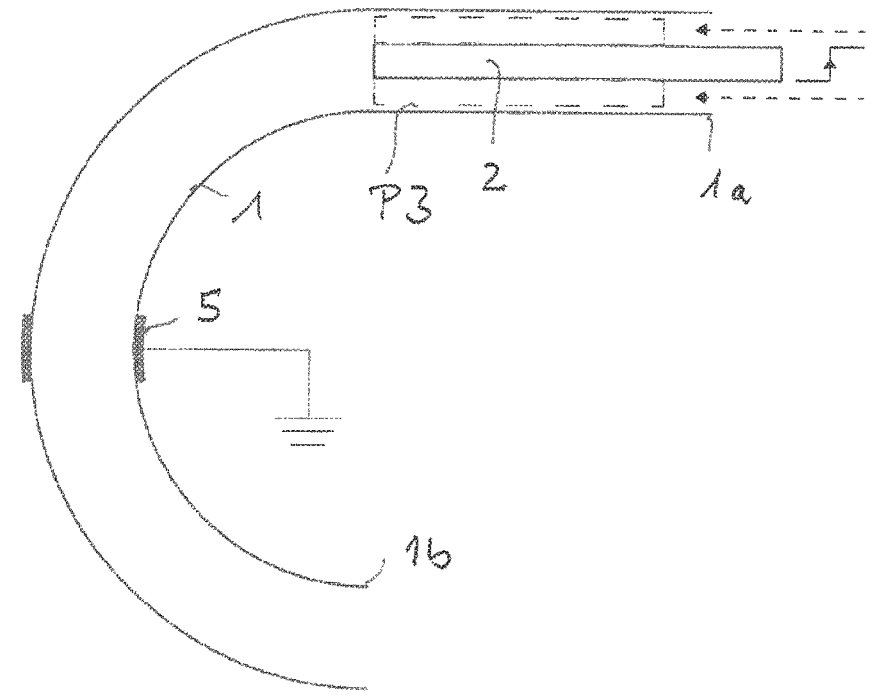
Figure 6:
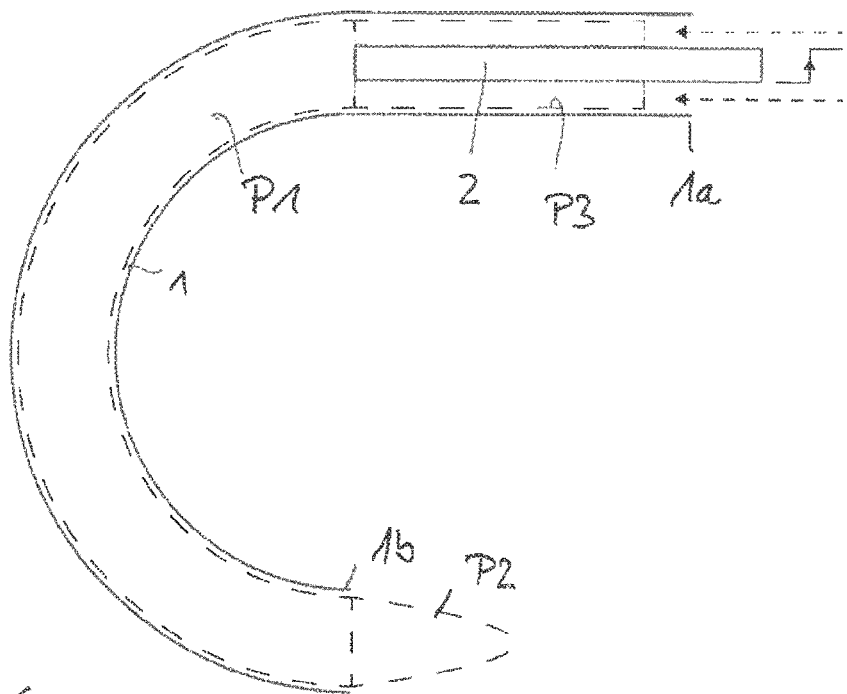
Figure 7:
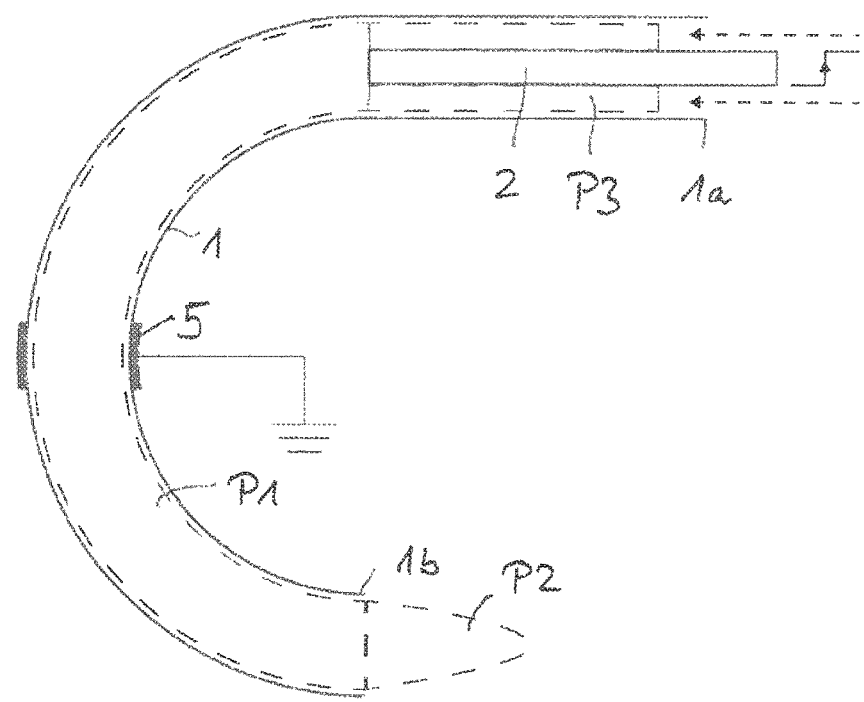

In the following, the invention is explained in greater detail as an example, using the drawing. This drawing shows, in a magnified schematic representation, in each instance, in:

FIG. 1 a basic representation of a capillary with one electrode,

FIG. 2 a basic representation of a capillary with two electrodes,

FIG. 3 the capillary according to FIG. 1 with a plasma P1,

FIG. 4 the capillary according to FIG. 1 with a plasma P1 and a plasma P2,

FIG. 5 the capillary according to FIG. 2 with a plasma P3,

FIG. 6 the capillary according to FIG. 1 with the plasmas P1, P2, and P3, and in FIG. 7 the capillary according to FIG. 2 with the plasmas P1, P2, and P3.

In FIG. 1, a capillary 1 for carrying out the method according to the invention is shown schematically. This capillary 1 consists of a dielectric material, for example quartz glass, and is preferably configured to be flexible and bendable. For this purpose, the capillary 1 is provided with a coating of polyimide on the outside, for example, not shown. In this regard, the capillary 1 has an inside diameter between 50 and 400 µm. At the back end 1a of the capillary 1, a wire-shaped electrode 2 is inserted into the capillary 1. This electrode is connected, on the high-voltage side, with a high-voltage source, not shown, preferably a square-wave voltage source. This square-wave voltage is indicated with a voltage symbol 3. This square-wave voltage has a magnitude of 1 kV to 4 kV, and a frequency between 5 kHz to 60 kHz. In the embodiment according to FIG. 1, a further electrode is not provided. Bordering on the front end 1b, an inlet into a mass spectrometer is arranged at a slight distance of 1 cm, for example, or the front end 1b opens into an ionization chamber of an ion mobility spectrometer. In this embodiment of the capillary 1, the second electrode is formed by the surroundings or the housing of the analysis device. The surroundings of the capillary 1 then act as a capacitor.

A plasma gas is introduced into the back end 1a of the capillary 1, as indicated by broken-line arrows 4. The sample gas to be ionized is either also introduced through the back end 1a of the capillary 1 and thereby passed through the capillary 1, or it is supplied to the region of the exit from the capillary 1 from the outside, in other words at the front end 1b, without flowing through the capillary 1.

In FIG. 2, the same capillary 1 as in FIG. 1 is shown, with the difference that on the outside, for example in the central length region of the capillary 1, a second electrode 5, preferably in ring shape, is arranged, which is separated from the interior of the capillary 1 by means of the dielectric wall of the capillary 1. The second electrode 5 is connected with the ground of the high-voltage source, as indicated by a ground symbol 6.

In FIGS. 3 to 7, different examples of the different plasma formation are shown:

In FIG. 3, a plasma P1 is shown, which extends from the tip of the electrode 2 all the way to the front end 1b of the capillary 1.

In FIG. 4, a situation is shown, in which not only the plasma P1 forms, but also a plasma P2 at the exit from the capillary 1.

In FIG. 5, the capillary 1 is shown with the first electrode 2 and the second electrode 5, wherein a third plasma P3 forms only in the region of the electrode 2.

FIG. 6 shows a situation with the capillary 1 without a second electrode 5, in which all the plasmas P1, P2, and P3 are formed.

Finally, FIG. 7 shows a situation with the capillary 1 with the second electrode 5, in which also all the plasmas P1, P2, and P3 are formed.

The presence of the different plasmas P1, P2, P3 and the spread of the respective plasma depends on the geometries selected (inside diameter of the capillary 1 and diameter of the wire-shaped electrode 2) and the plasma gas used in each instance. Fundamentally, the situation is that first the plasma P1 at the tip of the electrode 2 ignites, and this plasma P1 then spreads out further and further along the channel within the capillary, as the voltage increases; this spread can be promoted by the additional electrode 5. After the back end 1b of the capillary 1 is reached, the smaller plasma P2 occurs in addition to the plasma P1.

If the voltage is increased further, the further plasma P3 can occur in addition, in particular if helium or argon is used as the plasma gas.

Of course, the invention is not restricted to the exemplary embodiments shown. Further embodiments are possible without departing from the basic idea. Fundamentally, the capillary 1 does not have to be configured to be bendable, as shown; it can also be rigid and run in a straight line; the essential thing is that the wire-shaped electrode 2 arranged in the interior is connected with the high-voltage source on the high-voltage side.

REFERENCE SYMBOL LIST 1 capillary
1a back end
1b front end
2 electrode
3 voltage symbol
4 arrows
5 electrode
6 ground symbol
P1 plasma
P2 plasma
P3 plasma

The invention claimed is:

1. A method for ionization of gaseous samples by means of dielectric barrier discharge and for subsequent analysis of the sample ions produced, in an analysis device,
   wherein the sample ions are produced by means of a plasma that is brought about by means of a dielectric barrier discharge,
   wherein the dielectric barrier discharge is generated in that a plasma gas is supplied through a flexible, bendable capillary composed of a dielectric material,
   wherein a wire-shaped electrode is arranged within the capillary, which electrode is connected with an alternating voltage source on the high-voltage side,
   wherein the gaseous sample is supplied to the exit region of the capillary, and
   wherein the wire-shaped electrode is inserted only in the back end of the capillary.

2. The method according to claim 1, wherein the ground of the alternating voltage source is connected with an electrode arranged on the outside of the capillary.

3. The method according to claim 1, wherein helium, argon, hydrogen, nitrogen or air is used as the plasma gas.

4. The method according to claim 1, wherein a square-wave voltage is used as the alternating voltage.

5. The method according to claim 4, wherein the frequency of the square-wave voltage amounts to 5 to 60 kHz.

6. The method according to claim 4, wherein a square-wave voltage in the range of 1 to 4 kV is used.

7. The method according to claim 1, wherein a capillary composed of quartz glass with an outer coating of polyimide is used.

8. The method according to claim 1, wherein a capillary with an inside diameter between 50 and 400 µm is used.

9. The method according to claim 1, wherein the gaseous sample is supplied through the capillary.

10. The method according to claim 1, wherein the gaseous sample is supplied to the exit region of the capillary from the outside, without passing through the capillary.

* * * * *